United States Patent [19]
Guclu et al.

[11] Patent Number: 5,726,571
[45] Date of Patent: Mar. 10, 1998

[54] APPARATUS AND METHOD FOR REAL-TIME K-SPACE MAPPING OF THE SCANNING OPERATION OF A MAGNETIC RESONANCE IMAGING SYSTEM

[75] Inventors: C. Celil Guclu, Irvine; Orhan Nalcioglu, Laguna Beach, both of Calif.

[73] Assignee: The Regents of the University of California, Oakland, Calif.

[21] Appl. No.: 637,098

[22] Filed: Apr. 24, 1996

[51] Int. Cl.⁶ ................................................. G01V 3/00
[52] U.S. Cl. ............................................. 324/322; 324/307
[58] Field of Search ......................... 324/117 R, 300, 324/318, 322, 307, 316

[56] References Cited

U.S. PATENT DOCUMENTS

| | | | |
|---|---|---|---|
| 5,270,657 | 12/1993 | Wirth et al. | 324/322 |
| 5,521,507 | 5/1996 | Rohan et al. | 324/322 |
| 5,570,022 | 10/1996 | Ehnholm et al. | 324/319 |

OTHER PUBLICATIONS

Mathematical Aspects of NMR Tomography, O. Nalcioglu; IEEE Transactions Nuclear Science 31, 983–89 (1984).
A Simple Graphical Representation of Fourier–Based Imaging Methods; S. Ljunggren; J. Mag. Reson. 54, 338–343 (1983).
The K–Trajectory Formulation of the NMR Imaging Process With Appln & Analysis in Thesis of the Imaging Methods, Med Phys. 10(5) 1983.
Image Reconstruction for Echo Planar Imaging With Non-equidistant K–Space Sampling; H. Bruder; Mag Reson. Med 23, 311–23 (1992.
A Method of Measuring Field–Gradient Modulation Shapes; T. Onodera; J. Phys. E: Sci. Instrum. 20, 416–419 (1987).
Compensation of Multi–Dimensional Selective Excitation Pulses Using Measured K–Space Trajectories; A. Takahashi; Mag Reson Med 34, (1995).

*Primary Examiner*—Louis M. Arana
*Attorney, Agent, or Firm*—Daniel L. Dawes

[57] ABSTRACT

The gradient coil currents driving the RF gradient coil within an magnetic resonance imaging system are noninvasively monitored with Hall-effect sensors to produce a real-time, k-space map of the scanning gradient coil currents. The k-space map, when visually depicted, readily displays imperfections in the magnetic resonance imaging scanning hardware and software, more particularly in the scanning gradient coil currents. Based on the k-space map imperfections which are determined from analysis of the k-space map, operation of the magnetic resonance imaging system may be remotely monitored in real-time, and remotely repaired or altered to improve the magnetic resonance image quality. The k-space, real-time map can also be used as a real-time system development for use as a research and design tool for magnetic resonance imaging systems.

22 Claims, 5 Drawing Sheets

APPARATUS AND METHOD FOR REAL-TIME K-SPACE MAPPING OF THE SCANNING OPERATION OF A MAGNETIC RESONANCE IMAGING SYSTEM

BACKGROUND OF THE INVENTION

1. Field of the Invention

The invention relates to the field of magnetic resonance imaging (MRI) and in particular to an apparatus and method that allows certain MRI hardware imperfections to be graphically depicted, which in turn can be used for remote monitoring of the scanning equipment, equipment diagnosis, research and design of MRI systems, and improved imaging quality.

2. Description of the Prior Art

Magnetic resonance imaging is a technology wherein biological objects, such as human patients, are three dimensionally scanned by taking a sequence of two dimensional planar scans through the body part which is to be observed. The body part is exposed within a high intensity static field and excited by a gradient coil which applies RF-modulated magnetic fields to the scanned object. At certain frequencies nuclear magnetic resonance, typically with bound hydrogen in the biologic material, provides a feedback signal from which an image of the three dimensional, geometric structure of the tissue can be reconstructed.

The gradient coil provides a RF-modulated excitation field typically in the x, y and z directions or some combination thereof. Although the image is usually rendered in Euclidian geometric space, it is often more useful to visualize the RF-modulated excitation fields of the gradient coil in the related k-space. Use of k-space has been exploited by many others to explain the operation of the imaging and/or spectroscopic pulse sequences. See for example, O. Nalcioglu, *"Mathematical Aspects of NMR Tomography,"* IEEE Transactions Nuclear Science 31, 983–89 (1984); S. Ljung, *"A Simple Graphical Representation of Fourier Based Imaging Methods,"* J. Mag. Reson. 54, 338–483 (1983); D. B. Twieg, *"The K Trajectory Formulation of the NMR Imaging Process with Applications and Analysis in Thesis of the Imaging Methods,"* Med. Phys. 10(5), 610–21 (1983); and H. Bruder, et al., *" Image Reconstruction for Echo Planar Imaging with Non-Equidistant k-space Sampling,"* Mag. Reson. Med. 23, 311–23 (1992). There has also been attempts to measure the gradient waveforms to obtain this k-space. See for example T. Onodera, et at., *"A Method of Measuring Field Gradient Modulation Shapes, Application of High Speed NMR Spectroscopic Imaging,"* J. Phys. E: Sci. Instrum. 20, 416–19 (1987), and A. Takahashi, et al., *"Compensation of Multidimensional Selective Excitation Pulses Using Measured k-space Trajectories,"* Mag. Reson. Med. 34, 446–56 (1995). Onodera for example proposed a method for measuring the waveforms of a time varying gradient using high speed MRI. Onodera employed a self-encoding gradient which calibrated the gradient modulation to be measured. More recently, Takahashi has expanded this method to two spatial dimensions and used it to compensate the multiple dimensional selective excitation pulses. However, methods relying on the shape of k-space of the gradient waveforms would be more effective if the actual gradient waveforms could be obtained with little modification of the scanner hardware.

Therefore, what is needed is some type of apparatus and method to obtain real gradient waveforms and the corresponding k-space therefrom. Once obtained, the k-space map then needs to be graphically depicted to make the k-space imperfections arising from the actual hardware or software visually apparent. Such a depiction can then be used either to correct the imperfections, if possible, to develop dedicated reconstruction methods for specific MRI hardware taking the errors into account.

BRIEF SUMMARY OF THE INVENTION

The invention is an improvement in a magnetic resonance imaging (MRI) system having a gradient coil and gradient coil current supplied thereto comprising at least one gradient coil current monitor to monitor the gradient coil current waveform, which preferably monitors the current noninvasively, i.e. without disturbing the designed electrical characteristics and performance of the balance of the system. In this way the invention is ideally suited for retrofitting previously designed MRI systems. An integrator generates a spatial frequency variable, k, corresponding to the gradient current waveform. The integrator is coupled to the noninvasive current monitor. In the illustrated embodiment the integrator is a software controlled computer coupled to a waveform recorder, but the invention also contemplates that this function may be performed by custom hardware, firmware or the computer within the MRI system itself. A computer is programmed to generate a map a k-space map corresponding to the gradient coil current. The computer is coupled to the integrator or may include the integrator as a software configured portion. As a result, a real time k-space map of a scanning operation within the magnetic resonance imaging system is obtained.

The noninvasive current monitor is preferably a Hall-effect current monitor. In one embodiment at least two noninvasive current monitors are provided. Each current monitor measures a gradient coil current corresponding to a different encoding direction of scan within the magnetic resonance imaging system. The different directions are orthogonal to each other. In the illustrated embodiment the magnetic resonance imaging system is an echo planar imaging pulse sequence. The pulse sequence is the set of console commands that determine the gradient coil currents, rf modulation, and data acquisition protocol which is used. Many pulse sequences can be used with the invention, such as spinnaker, gradient echo, flash, grass, echo planar and many others.

The k-space map is produced with each scan in real time performed within the magnetic resonance imaging system. The noninvasive current monitor samples the gradient coil current directly from the gradient coil within the magnetic resonance imaging system. For example, the magnetic resonance imaging system has at least one electromagnetic interference filter coupled between the magnetic resonance imaging system and the gradient coil. The noninvasive current monitor samples the gradient current between the EMI filter and the gradient coil without substantially altering any electrical characteristics of the magnetic resonance imaging system.

The invention is also defined as an improvement in the method for performing magnetic resonance imaging scans comprising the steps of monitoring at least one current to a gradient coil contained within an magnetic resonance imaging system. The spatial frequency variable, k, corresponding to the noninvasively monitored gradient coil currents is generated. A k-space map corresponding to the gradient coil current in real time is then generated so that scanning operation within the magnetic resonance imaging system is visually depicted.

In another embodiment of the method of the invention, the method further comprises the step of remotely monitoring the k-space and diagnostically analyzing operation of the magnetic resonance imaging system in response to the remotely monitored real-time k-space map. The improvement also comprises remotely repairing the magnetic resonance imaging system in response to diagnostic analysis of the remotely monitored k-space map. The method still further comprises altering the gradient coil currents to improve scanning within the magnetic resonance imaging system based upon analysis of the k-space map. The improvement comprises determining design changes needed with respect to the magnetic resonance imaging system based upon analysis of the k-space map.

The invention may be better visualized by now turning to the drawings wherein like elements are referenced by like numerals.

The invention in its various embodiments may now be understood by mining to the following detailed description.

DETAILED DESCRIPTION OF THE PREFERRED EMBODIMENTS

The gradient coil currents driving the gradient coil within an magnetic resonance imaging system are noninvasively monitored with Hall-effect sensors to produce a real-time, k-space map of the scanning gradient coil currents. The k-space map, when visually depicted, readily displays imperfections in the magnetic resonance imaging scanning hardware and software, more particularly in the scanning gradient coil currents. Based on the k-space map imperfections which are determined from analysis of the k-space map, operation of the magnetic resonance imaging system may be remotely monitored in real-time, and remotely repaired or altered to improve the magnetic resonance image quality. The k-space, real-time map can also be used as a real-time system development for use as a research and design tool for magnetic resonance imaging systems.

Various hardware and software imperfections lead to artifacts in the reconstructed image, especially in fast imaging sequences in MRI systems. These imperfections are due to the fact that most of the reconstruction algorithms normally assume an ideal or perfect k-space sampling. As described below, the hardware system is provided to obtain real-time gradient waveforms in the actual k-space map using Hall-effect current sensors located at the outputs of the EMI filters or as close to the gradient coil as can be practically achieved. The availability of the k-space map after each scan or pre-scan is then used for fine tuning and shimming of the gradient currents.

Figure 1:
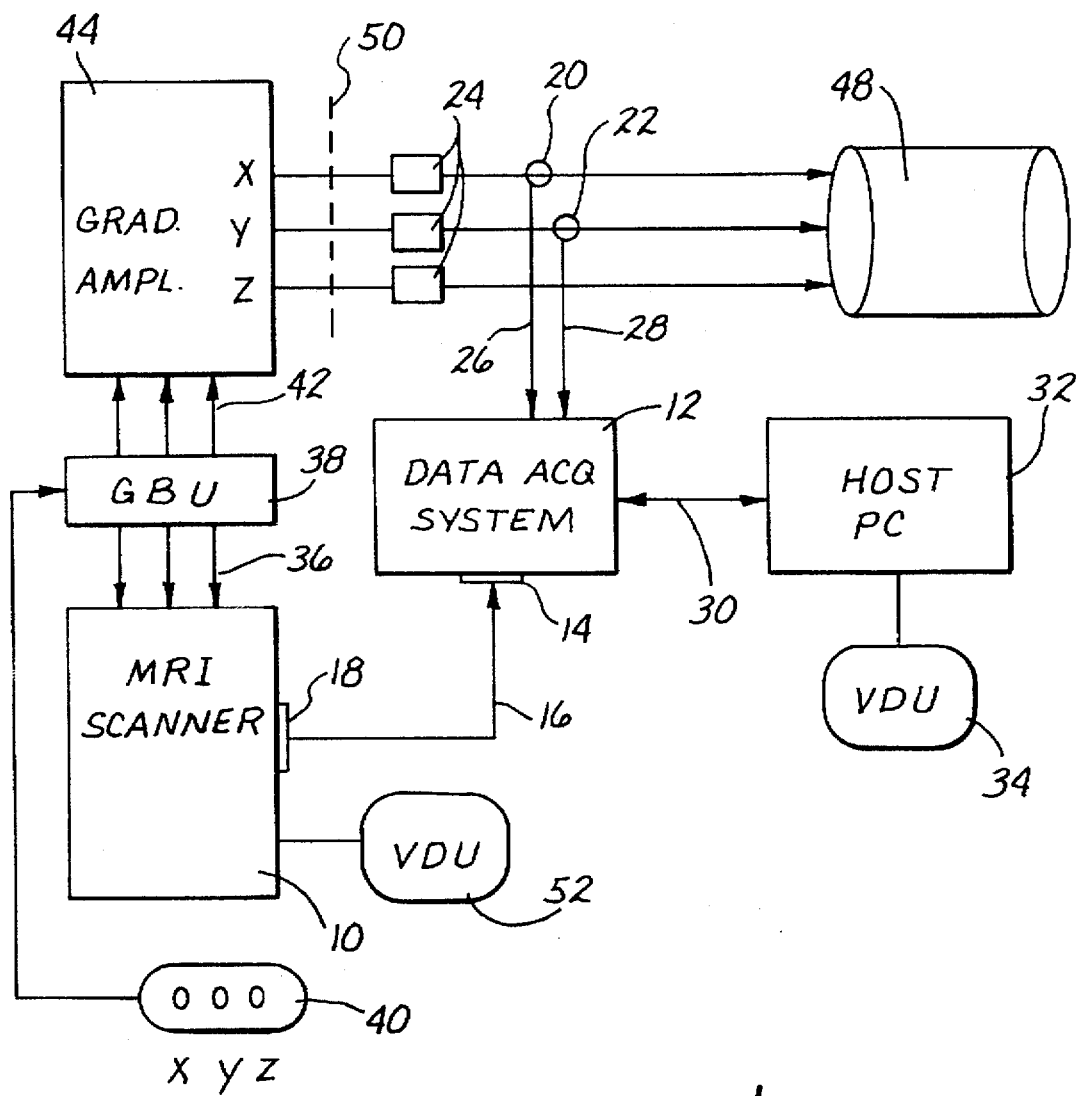
FIG. 1 is a simplified block diagram showing the hardware relating to a gradient coil monitor according to the invention.

Turn now for example to the system shown in block diagram FIG. 1. A Surrey Medical Imaging Systems MRI scanner, generally denoted by referenced 10, is interfaced with a 1.5 Tesla Oxford Wholebody Magnet (not shown), and a LeCroy 6810 Waveform Recorder 12, having its trigger input 14 coupled by line 16 to user port 18 of MRI scanner 10. Scanner MRI includes a conventional console, keyboard, controls and a video output monitor 52. Two Hall-effect sensors 20 and 22, such as manufactured by F. W. Bell of Orlando, Fla., are provided at or near the output of electromagnetic interference filters (EMI) filters 24 and have their outputs 26 and 28 coupled to waveform recorder 12. Waveform recorder 12 is a solid state recorder and has its data output line 30 coupled to a conventional IBM compatible personal computer 32 provided with a video output display 34.

MRI scanner 10 has its outputs 36 coupled to a gradient buffer unit 38, which in the illustrated embodiment includes an input module 40, which is either remotely or directly integrated with buffer 38 to provide first order shimming of the gradient currents. Gradient buffer unit 38 provides signal buffering and some user control or modification options to the command signals generated by scanner 10 to gradient amplifier 44. In the illustrated embodiment, first order shimming is provided for the x, y and z gradient signals independently through a manual potentiometer adjustment. Output 42 of gradient buffer unit 38 is then provided as the input to gradient amplifier 44 which generates the x, y and z gradient coil currents at outputs 46. These currents are then coupled through a penetration panel 50 to EMI filters 24 and thence to gradient coil 48 diagrammatically depicted in FIG. 1 in isolation but actually included within the wholebody magnet as is in conventional MRI systems.

Two input channels 26 and 28 of waveform recorder 12 are connected to Hall-effect current sensors 20 and 22 respectively, which sensors are coupled between EMI filters 24 and gradient coil 48. The patient exposure site which includes EMI filters 24, gradient coil 48 and the wholebody magnet is isolated from the control and monitoring equipment which comprises the balance of the elements shown in FIG. 1. Current sensors 20 and 22 were chosen of the closed-loop type to obtain fast response and better linearity as well as less susceptibility to noise than would be the case with their open-loop counterparts. Where in the illustrated embodiment recorder 12 is shown as coupled to personal computer host computer 32 having a video monitor 34, it is also contemplated that computer 32 may be eliminated and a general purpose interface board will be used to couple sensors 20 and 22 directly into the computer system of scanner 10, which may be suitably software and hardware modified to perform the functions described herein for recorder 12 and computer 32.

In the illustrated embodiment, a conventional gradient echo or echo planar imaging (EPI) sequence was used with a 64×128 matrix size. Gradient offsets were carefully nullified for each data acquisition. The gradient waveforms measured at outputs 26 and 28 of current sensors 20 and 22 were sampled at 200 kHz per channel with 12-bit resolution. Total acquisition time was approximately 83 milliseconds. The way in which sample data is processed directly falls from the generic definition of k-space defined by Equation 1 below, where $k_x$ and $k_y$ are the x and y components of the k-vector, $\gamma$ the gyromagnetic ration, G is the gradient waveform, and t is time.

$$2\pi k_x = \int \gamma G_x(t) dt$$

$$2\pi k_y = \int \gamma G_y(t) dt$$

Since readout and phase encoding gradient waveforms on channels 26 and 28 are sampled at time intervals $\Delta t$, the discretized version of the gradient waveform equation can be express as $G_{x,y}[i\Delta t]$ from which discrete frequency variables, $k_x$ and $k_y$, can be obtained, namely $k_x[n]$ and $k_y[n]$ are calculated in discrete form using Equation 2 below.

$$2\pi k_x[n] = \gamma \Delta t \Sigma_{i=1}^n G_x[i\Delta t]$$

$$2\pi k_y[n] = \gamma \Delta t \Sigma_{i=1}^n G_y[i\Delta t] \quad (2)$$

where $1 \leq n \leq N$, where N is the total number of data samples, which was 16,382 in the illustrated embodiment, $\Delta t$ is the sampling interval of about 5 microseconds, and n the array index.

The k-space map can then be obtained by a parametric plot of the $k_x[n]$ and $k_y[n]$ variables. The x and y directions are assigned as the readout and phase encoding directions, respectively. Although this assignment is arbitrary.

Figure 2A:
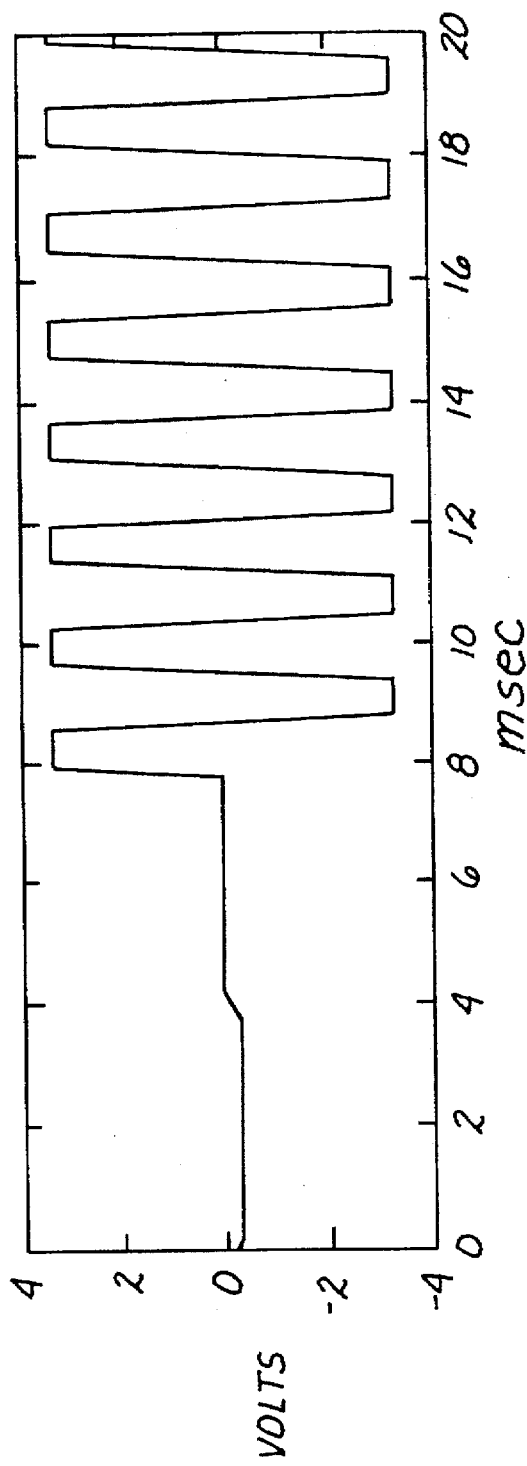
FIGS. 2a and 2b are graphs showing the voltage of the readout gradient and phase encoding gradient signals respectively during the first twenty milliseconds of the scanner output of the system in FIG. 1.
Figure 2B:
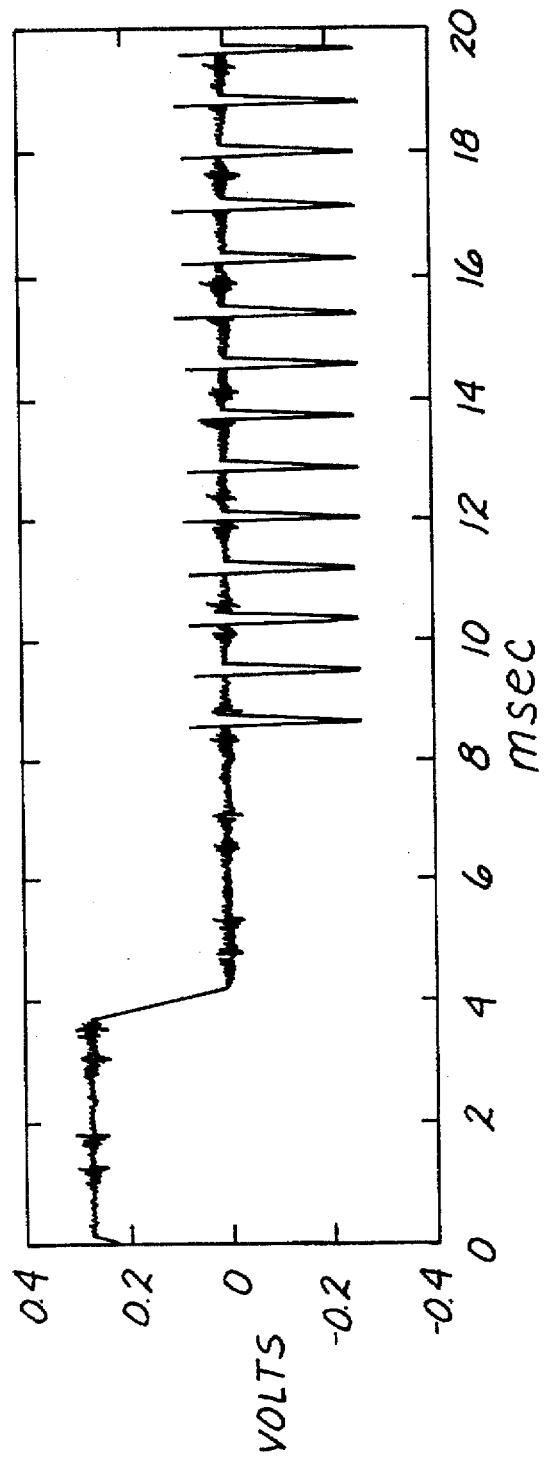
Figure 3:
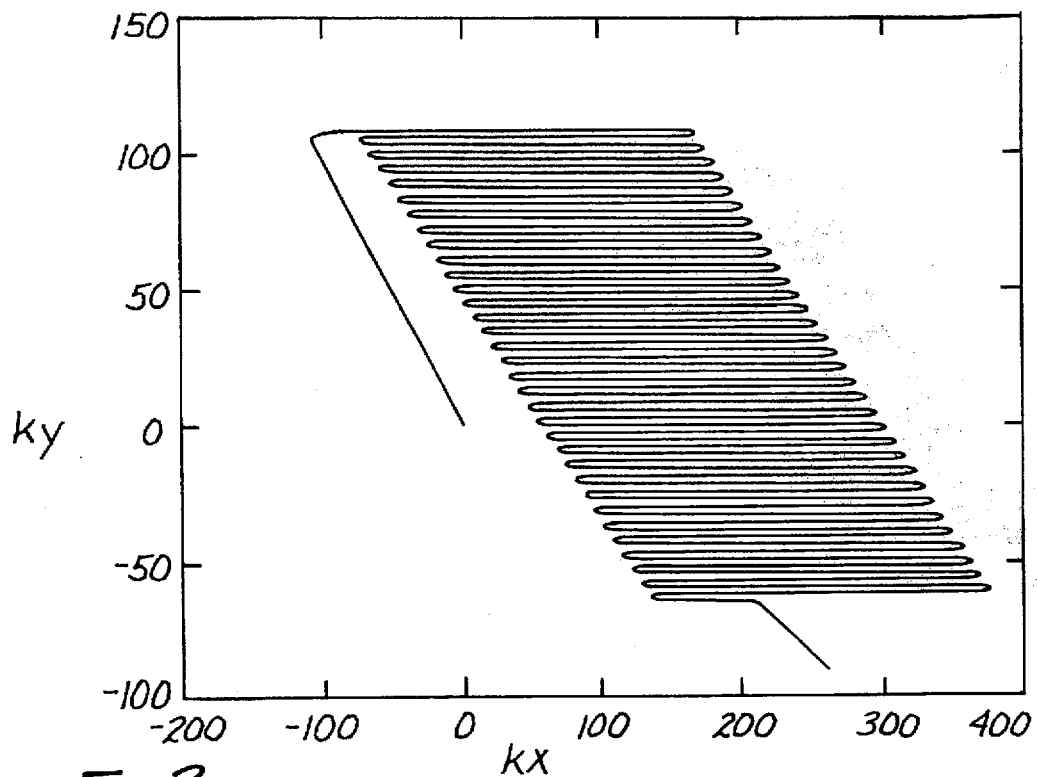
FIG. 3 is the two dimensional k-space plot obtained from the gradient signals of FIGS. 2a and 2b utilizing the apparatus of FIG. 1.

FIG. 2a and FIG. 2b shows the first 20 milliseconds of the readout gradient and phase encoding gradient waveforms at the console output of scanner 10 or the input of the gradient buffer unit 38. Based on the $k_x$ and $k_y$ values calculated according to Equation 2 above, a complete k-space map is scanned in 82 milliseconds as depicted in FIG. 3. The tilted appearance of the k-space is due in the illustrated embodiment to a 40 millivolt DC offset on the readout gradient which was virtually impossible to ascertain by examination of the gradient waveforms of FIGS. 2a and b. Such small offsets are difficult to perceive in the plot of the readout gradient waveform in FIG. 2a because of the large dynamic range but it becomes immediately apparent in the k-space map of FIG. 3. In the illustrated embodiment, this offset was corrected by using a first order gradient shimming of the gradient coil currents. The corrected gradient coil currents were sampled in the same manner as before.

Figure 4:
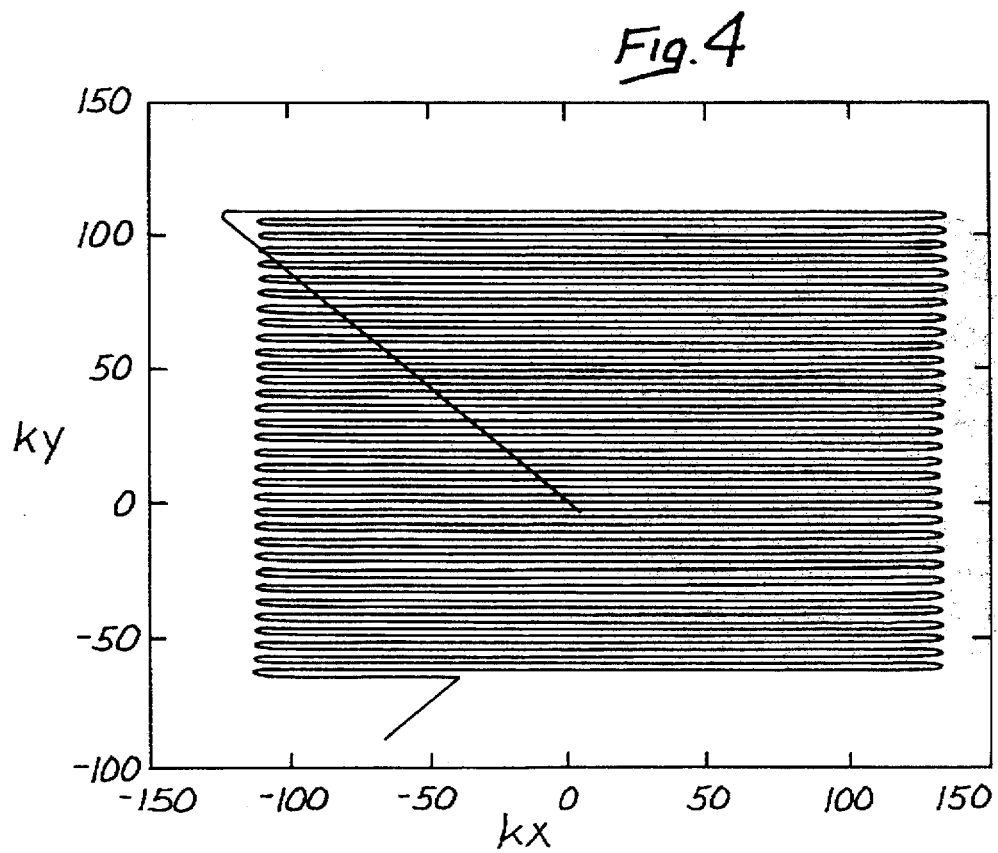
FIG. 4 is a two dimensional k-space depiction of the k-space of FIG. 3 after correction with a DC offset compensated by software correction according to one embodiment of the invention.
Figure 5A:
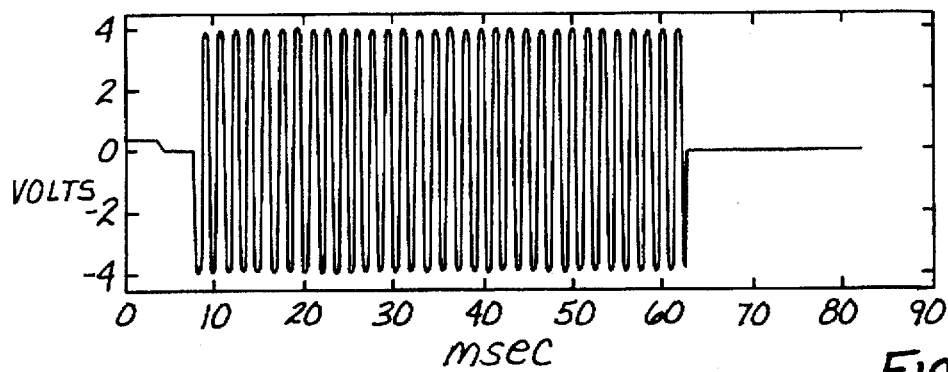
FIGS. 5a–5d are the readout and phase encoding gradients taken at the output of the EMI filters in FIG. 1 showing in FIGS. 5a and 5b 16,382 data acquisition points acquired during an approximately 82 millisecond scan with the first 15 milliseconds being shown in expanded time scales in FIGS. 5c and d corresponding to FIGS. 5a and b respectively.
Figure 5B:
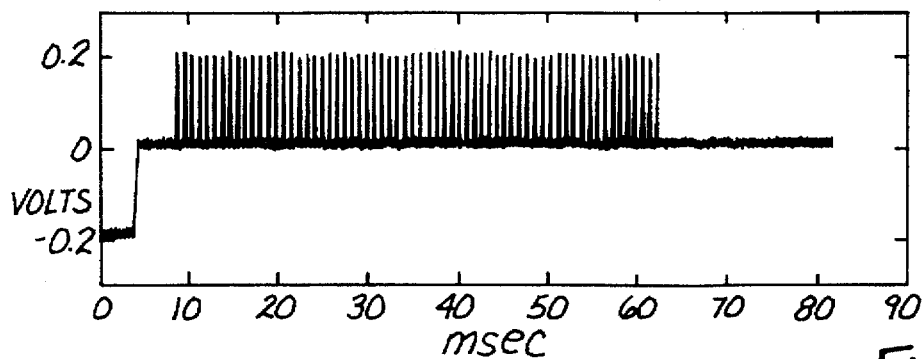
Figure 5C:
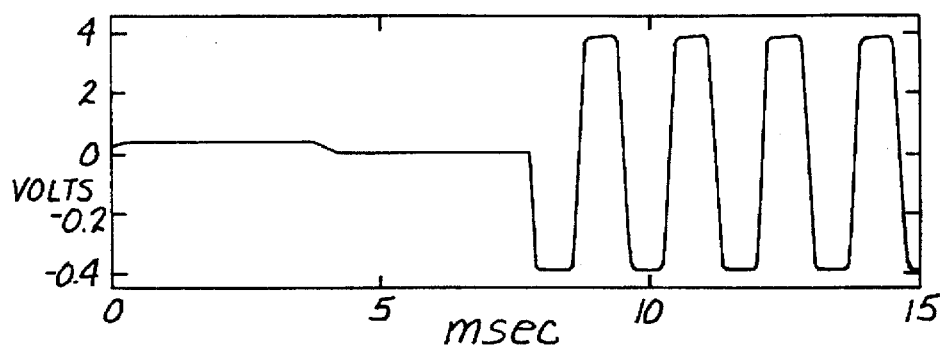
Figure 5D:
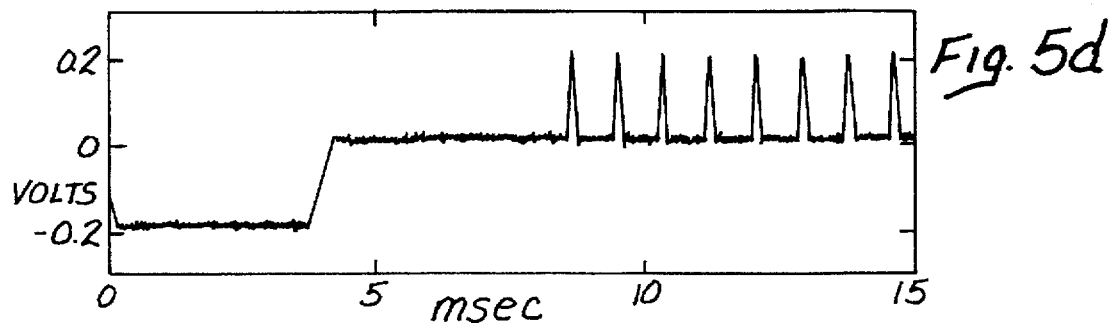
Figure 6:
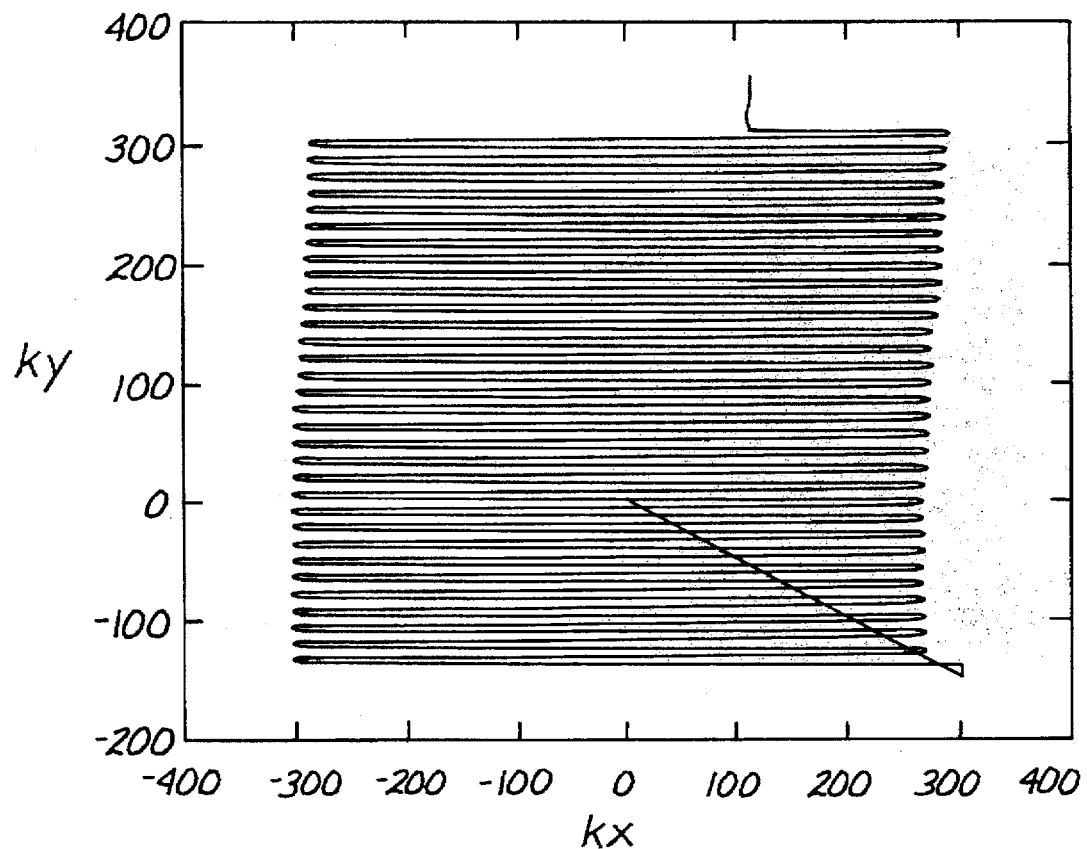
FIG. 6 is a measured k-space trajectory using the x and y gradient waveforms depicted in FIGS. 5a–5d.

If the readout gradient console output is software corrected, the k-space trajectory can be improved to the form shown in FIG. 4. In the corrected form the gradient waveforms and the k-space sample by using current sensors 20 and 22 are shown in FIGS. 5a and 5b for the entire 82 millisecond scan and in expanded form during the first 15 milliseconds in FIGS. 5c and d. The resultant k-space map is depicted in FIG. 6. Polarity is reversed due to an inverting amplifier between the console and gradient amplifier 44.

A careful examination of the specific k-space in FIG. 6 still shows two artifacts in the MRI system of the illustrated embodiment, which again cannot be easily ascertained by examination of the gradient waveforms output from scanner 10. First, there is an uneven sampling in the $k_x$ direction towards the right and left edges of the map which is evident by sighting up the +200 v and −200 v lines for $k_x$. The spacing between adjacent trajectory lines is uneven in each case, and even on the $k_x=0$ v line. Second, there is a slight power baseline or AC line fluctuation in the $k_y$ direction as evidenced by very notice rightward slant of the rectangular trace. In FIG. 6, $k_x$ and $k_y$, although actually having dimensions of $cm^{-1}$, are measured here in volts output from the Hall effect sensors 20 and 22 with one volt corresponding to approximately 26 amps in current through gradient coil 48. This conversion factor is calculated by comparing the waveforms required from gradient amplifier current monitor output with measurements using the Hall-effect current sensors.

In either case, what results is a graphic depiction of the k-space map in real time. This quick graphical readout is intended in the illustrated embodiment to be used in EPI reconstruction. However, the methodology of the invention can be applied to any type of pulse sequence and the resulting k-space map can be used to eliminate image artifacts due to imperfections and limitations in the scanner hardware.

By thus providing a quick graphic representation of k-space it is possible for the designer to make hardware and software corrections or simulations which will produce a perfected scan and thus enhanced MRI imaging and resolution.

The ability to provide real-time, k-space data output by noninvasively monitoring the actual gradient coil currents outside of the disturbing effects of the EMI filters 24 and/or gradient amplifier 44, i.e. without altering circuit performance, allows remote diagnostic monitoring and both software and hardware repair. For example, the system of FIG. 1 may be remotely connected on a continuous or selected basis with a remote monitoring center so that each time the equipment is used, the k-space map of the scan is detected, stored and/or processed. Software detection diagnostic programs may then check the quality of the k-space map and determine when the map becomes distorted beyond acceptable limits. The degree and nature of the distortion will then allow the remote diagnostic software or operator to determine what portion of the MRI system has contributed to the imperfect scan.

In many cases, such MRI systems are built with redundant circuitry that can be selectively and remotely turned on and off. Therefore, as certain circuits become aged or drift, causing the k-space map to go out of tolerance, those sections may be turned off and normally operating sections mined on followed by immediate observation of the k-space map to verify the remote diagnosis. Similarly, the software may be maintained or corrected where it has been corrupted by the same means or may be altered to compensate for drift or other changes in the software controlled hardware.

The advantages of such remote diagnostic monitoring results in a higher utilization and on-line time which is economically important for costly MRI systems and results in dramatic reduction in repair and diagnostic costs. Not only will the diagnosis of the MRI system be much easier to perform, but it will become unnecessary to transport a highly specialized and trained technician across long distances in order to perform an onsite diagnosis and repair.

Providing a real time k-space map will also provide researchers a powerful analytical tool by which they will be able to ascertain performance of an MRI scanner based on design changes which may be introduced. For example, at present new designs for a gradient coil must be tested by actual construction of the gradient coil at considerable time and expense. Even with artful and insightful construction of gradient coil 48, the efficacy of the new design cannot be determined until it is actually run on phantoms within an MRI system. The provision of an actual k-space map for a prototype gradient coil will provide an immediate and direct indication of how the pulse sequence or gradient subsystem comprising the gradient coil, buffer amplifier and current amplifiers, must be changed to obtain the desired k-space map. The nature and degree of a single change can then be predicted for any given new design rather than through discovered through a process of trial and error.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An improved magnetic resonance imaging system of the type having a gradient coil and gradient coil current supplied thereto, the improvement comprising:
   at least one gradient coil current monitor to monitor the gradient coil current waveform;
   an integrator for generating a spatial frequency variable k corresponding to said gradient current waveform, said integrator coupled to said noninvasive current monitor; and
   a computer programmed to generate a map of a k-space trajectory corresponding to said gradient coil current, said computer being coupled to said integrator, whereby a real time k-space map of a scanning operation within said magnetic resonance imaging system is obtained.

2. The improved imaging system of claim 1 wherein said current monitor is a noninvasive Hall-effect current monitor.

3. The improved imaging system of claim 1 wherein at least two current monitors are provided, each current monitor for measuring a gradient coil current corresponding to a different encoding direction of scan within said magnetic resonance imaging system.

4. The improved imaging system of claim 3 wherein said different directions are orthogonal to each other.

5. The improved imaging system of claim 1 wherein said k-space map is produced by a plurality of scans in real time performed within said magnetic resonance imaging system.

6. The improved imaging system of claim 5 wherein each scan within said magnetic resonance imaging system is an imaging pulse sequence.

7. The improved imaging system of claim 6 wherein said scan within said magnetic resonance imaging system is an echo planar imaging pulse sequence.

8. The improved imaging system of claim 1 wherein said current monitor samples said gradient coil current directly and noninvasively from said gradient coil within said magnetic resonance imaging system.

9. The improved imaging system of claim 1 wherein said magnetic resonance imaging system has at least one electromagnetic interference filter coupled between said magnetic resonance imaging system and said gradient coil and wherein said current monitor noninvasively samples said gradient current between said EMI filter and said gradient coil without substantially altering any electrical characteristics of said magnetic resonance imaging system.

10. The improved imaging system of claim 1 wherein said magnetic resonance imaging system has at least one electromagnetic interference filter coupled between said magnetic resonance imaging system and said gradient coil and wherein said current monitor samples said gradient current between said EMI filter and said gradient coil without substantially altering any electrical characteristics of said magnetic resonance imaging system.

11. An improved method for performing magnetic resonance imaging scans, the improvement comprising:
    monitoring at least one current to a gradient coil contained within an magnetic resonance imaging system;
    generating the spatial frequency variable function, k, corresponding to said noninvasively monitored gradient coil currents; and
    generating a k-space map corresponding to said gradient coil current in real time so that scanning operation within said magnetic resonance imaging system is visually depicted.

12. The improved method of claim 11 where monitoring gradient coil currents is noninvasively performed by sampling said gradient coil currents with Hall-effect current sensors.

13. The improved method of claim 11 where monitoring gradient coil currents comprises noninvasively monitoring gradient coil currents for subcoils within said gradient coil which subcoils are oriented in at least two different directions.

14. The improved method of claim 13 where noninvasively monitoring said two different currents comprises noninvasively monitoring two currents coupled to subcoils within said gradient coil for generating magnetic fields in orthogonal directions to each other.

15. The improved method of claim 14 where generating said k-space map corresponding to said noninvasively monitoring currents displays a two dimensional k-space map of the magnetic resonance imaging scanning operation within said magnetic resonance imaging system.

16. The improved method of claim 11 where monitoring gradient coil currents directly noninvasively samples said gradient coil currents actually supplied by said magnetic resonance imaging system to said gradient coil.

17. The improved method of claim 11 where said magnetic resonance imaging system has an electromagnetic interference filter in circuit with each separate subcoil within said gradient coil and where monitoring said gradient coil currents comprises noninvasively sampling said gradient coil currents between said gradient coil and said EMI filter.

18. The improved method of claim 14 where said magnetic resonance imaging system has an electromagnetic interference filter in circuit with each separate subcoil within said gradient coil and where monitoring said gradient coil currents comprises noninvasively sampling said gradient coil currents between said gradient coil and said EMI filter.

19. The improved method of claim 11 further comprising remotely monitoring said k-space and diagnostically analyzing operation of said magnetic resonance imaging system in response to said remotely monitored real-time k-space map.

20. The improved method of claim 19 further comprising remotely repairing said magnetic resonance imaging system in response to diagnostic analysis of said remotely monitored k-space map.

21. The improved method of claim 11 further comprising altering said gradient coil currents to improve scanning within said magnetic resonance imaging system based upon analysis of said k-space map.

22. The improved method of claim 11 comprising determining design changes needed with respect to said magnetic resonance imaging system based upon analysis of said k-space map.

* * * * *